(12) United States Patent
Rinderknecht et al.

(10) Patent No.: US 6,463,110 B1
(45) Date of Patent: Oct. 8, 2002

(54) TIMING SYNCHRONIZATION IN A COMMUNICATION DEVICE

(75) Inventors: William J. Rinderknecht, Streamwood, IL (US); Anthony R. Schooler, Bartlett, IL (US); Kevin M. Andrews, Kenosha, WI (US); Yun Kim, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 15 days.

(21) Appl. No.: 09/813,708

(22) Filed: Mar. 21, 2001

(51) Int. Cl.[7] ............................................... H04L 7/00
(52) U.S. Cl. ....................................................... 375/355
(58) Field of Search ................................. 375/355, 371, 375/372, 290, 346, 350, 229; 708/300, 301, 313, 322, 319, 323

(56) References Cited

U.S. PATENT DOCUMENTS

| | | | |
|---|---|---|---|
| 4,905,101 A | * | 2/1990 | Ohta et al. .................. 341/110 |
| 5,375,146 A | * | 12/1994 | Chalmers ..................... 375/344 |
| 5,651,035 A | | 7/1997 | Tozun et al. ................. 375/373 |
| 5,838,744 A | | 11/1998 | Zheng ......................... 375/355 |
| 6,317,765 B1 | * | 11/2001 | Page et al. ................... 708/313 |
| 6,380,983 B1 | * | 4/2002 | Miyazaki et al. ............ 348/554 |

FOREIGN PATENT DOCUMENTS

| | | | |
|---|---|---|---|
| EP | 0654914 A2 | 5/1995 | ........... H04B/1/707 |
| WO | WO 00/38344 | 6/2000 | ........... H04B/1/707 |

* cited by examiner

*Primary Examiner*—Tesfaldet Bocure
(74) *Attorney, Agent, or Firm*—Brian M. Mancini

(57) ABSTRACT

A method for performing timing synchronization between digital input data and a system clock in a communication device includes providing a system clock rate that is higher than a data clock rate and sampling the input data at intervals in the system clock periods within the data clock period. The method includes adjusting the timing between the digital input data and the system clock by either shortening the number of system clock periods and sampling intervals, or lengthening the number of system clock periods and sampling the input data at normal intervals and providing data insertion to fill one of the extra system clock periods, such that more data samples are provided in the data clock period.

20 Claims, 7 Drawing Sheets

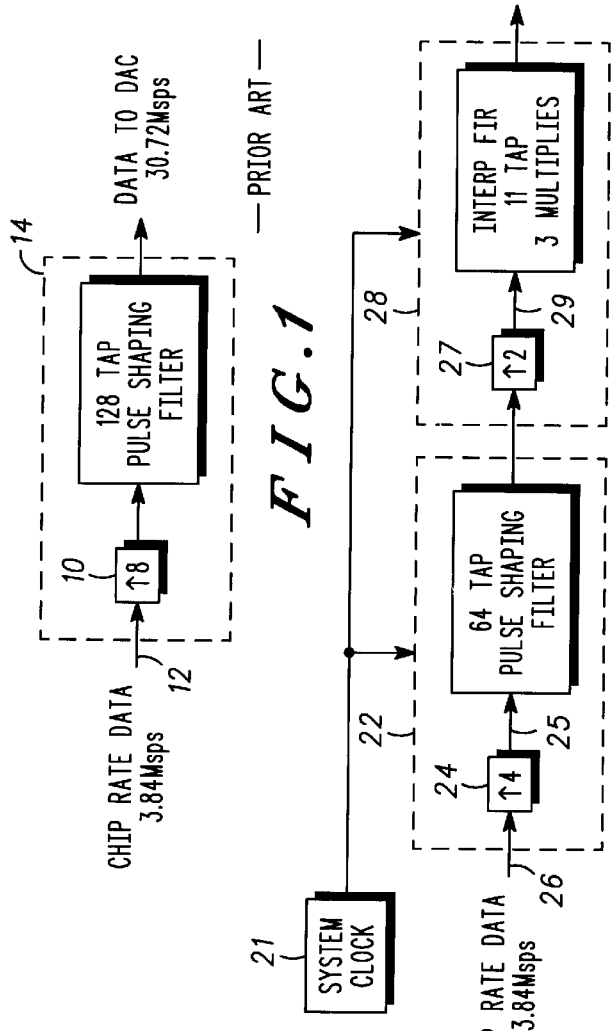
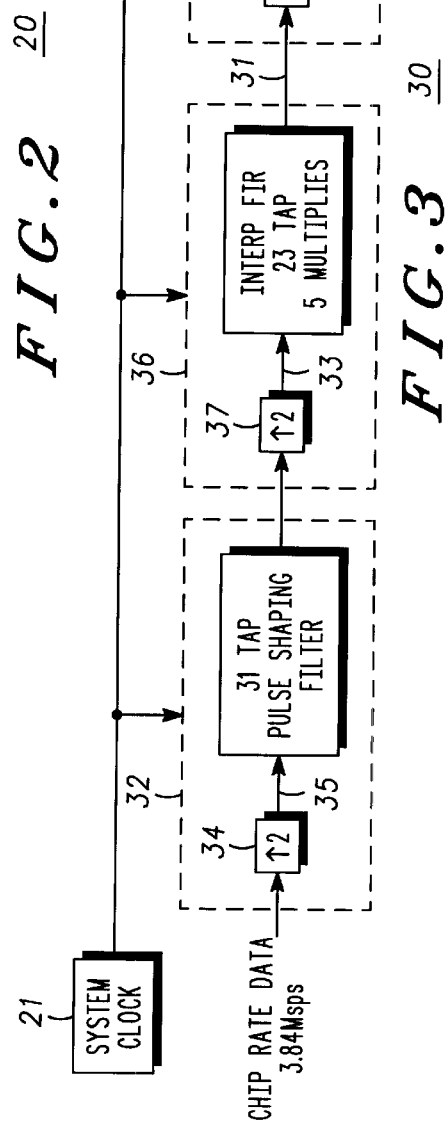

| ADDRESS | TIME VALUE |
|---|---|
| 0 | N7 |
| 1 | N8 |
| 2 | N9 |
| 3 | N10 |
| 4 | N11 |
| 5 | N12 |
| 6 | N13 |
| 7 | N14 |
| 8 | N15 |
| QPTR → 9 | N0 |
| 10 | N1 |
| 11 | N2 |
| 12 | N3 |
| 13 | N4 |
| 14 | N5 |
| 15 | N6 |

*FIG. 7*

COEFFICIENTS $C_0$, 0, $C_2$, 0, $C_4$, 0, $C_6$, 0, $C_8$, 0, $C_{10}$, $C_{11}$, $C_{10}$, 0, $C_8$, 0, $C_6$, 0, $C_4$, 0, $C_2$, 0, $C_0$ $N_0$, 0, $N_1$, 0, $N_2$, 0, $N_3$, 0, $N_4$, 0, $N_5$, 0, $N_6$, 0, $N_7$, 0, $N_8$, 0, $N_9$, 0, $N_{10}$, 0, $N_{11}$  ← OUT0

0, $N_0$, 0, $N_1$, 0, $N_2$, 0, $N_3$, 0, $N_4$, 0, $N_5$, 0, $N_6$, 0, $N_7$, 0, $N_8$, 0, $N_9$, 0, $N_{10}$, 0  ← OUT1

HISTORY WITH ZERO FILL

*FIG. 9*

| CLOCK CYCLE | FIR CNT | UP ADR | DOWN ADR | COEF ADR | UP0 | DOWN0 | CEOF0 | UP1 | DOWN1 | COEF1 | DESCRIPTION |
|---|---|---|---|---|---|---|---|---|---|---|---|
| 0 | 0 | 9 | 8 | 0 | A9 | A8 | A0 | A10 | A7 | A2 | ACCUM LOADED WITH: (N0+N15)*C0+(N1+N14)*C2 |
| 1 | 1 | 11 | 6 | 2 | A11 | A6 | A4 | A12 | A5 | A6 | (N2+N13)*C4+(N3+N12)*C6 IS ADDED TO ACCUM |
| 2 | 2 | 13 | 4 | 4 | A13 | A4 | A8 | A14 | A3 | A10 | (N4+N11)*C8+(N5+N10)*C10 IS ADDED TO ACCUM |
| 3 | 3 | 15 | 2 | 8 | A15 | A2 | A12 | A0 | A1 | A14 | (N6+N9)*C12+(N7+N8)*C14 IS ADDED TO ACCUM, ACCUM WILL CONTAIN THE FIRST I/Q RESULT |
| 4 | 4 | 9 | 7 | 1 | A9 | A7 | A1 | A10 | A6 | A3 | ACCUM LOADED WITH: (N0+N14)*C1+(N1+N13)*C3 |
| 5 | 5 | 10 | 6 | 3 | A11 | A5 | A5 | A12 | A4 | A7 | (N2+N12)*C5+(N3+N11)*C7 IS ADDED TO ACCUM |
| 6 | 6 | 11 | 5 | 5 | A13 | A3 | A9 | A14 | A2 | A11 | (N4+N10)*C9+(N5+N9)*C11 IS ADDED TO ACCUM |
| 7 | 7 | 12 | 4 | 7 | A15 | A1 | A13 | A0 | ZERO | A15 | (N6+N8)*C13+N7*C15 IS ADDED TO ACCUM, ACCUM WILL CONTAIN THE SECOND I/Q RESULT |

FIG. 8

NOTE, X REPRESENT DATA SAMPLES, 0 REPRESENT ZERO STUFF

COEFFICIENTS

TIMING SYNCHRONIZATION IN A COMMUNICATION DEVICE

FIELD OF THE INVENTION

The present invention relates generally to communication devices, and more particularly to timing synchronization in a communication device.

BACKGROUND OF THE INVENTION

In order to facilitate proper communication between digital devices it is typically necessary that the devices have synchronized timing. Generally, existing wireless handheld communication devices, such as cellular telephones, are synchronized at the beginning of transmissions, but are then left to the accuracy of their internal clocks to maintain timing synchronization. However, it is practically impossible for a receiving device and a transmitting device to have the exact same clock frequency. Moreover, internal clocks of devices are subject to various timing anomalies due to such causes as jitter, mechanical shock, temperature drift, and aging effects.

Compensation for timing problems can be accomplished by advancing or delaying an input digital data stream relative to the sampling clock in a transmit filter of the device. However, the advance or delay of samples creates two problems. The first problem is that advancing samples requires dropping samples and requires more computational power to compute the sample in a smaller amount of time. The second problem is the distortion that is added by the advance or delay of a sample. Prior art techniques added more computational power to accommodate for the reduced amount of time to process the sample data. However, output samples were dropped causing the output signal to be distorted, degrading the filter performance. Moreover, input samples were delayed simply by repeating samples, which also introduces distortion.

For most air-interfaces, timing synchronization is generally accomplished in the digital filter sections of a transceiver. In particular, finite-impulse-response (FR) filters have been utilized, to advantage because they are relatively inexpensive due to either the data rate being low or because the input data stream is only one bit wide. However, some new protocols, such as 3GPP (Third Generation Partnership Project), IS-95B, and IS-2000, transmit data with multiple spreading codes at very high data rates. This results in a digital filter that requires much more computation and, therefore, is much more expensive.

Accordingly, what is needed is an apparatus and method to compensate for clock frequency differences between a digital communication device and a digital signal in order to ensure that the data is transferred correctly. It would also be of benefit, to provide a compensation scheme that reduces distortion. Moreover, it would be an advantage to provide timing synchronization with reduced computational complexity and cost without a significant performance reduction.

BRIEF DESCRIPTION OF THE DRAWINGS

FIG. 1 is a simplified block diagram of a timing synchronization filter of the prior art;

FIG. 2 is a simplified block diagram of a first embodiment of a timing synchronization filter, in accordance with the present invention;

FIG. 3 is a simplified block diagram of a preferred embodiment of a timing synchronization filter, in accordance with the present invention;

FIGS. 7 and 8 are charts demonstrating the function of the pulse-shaping filter of FIG. 5;

FIG. 9 is a chart of the application of the first interpolator filter coefficients of FIG. 3;

DETAILED DESCRIPTION OF THE PREFERRED EMBODIMENTS

Figures 4, 5:
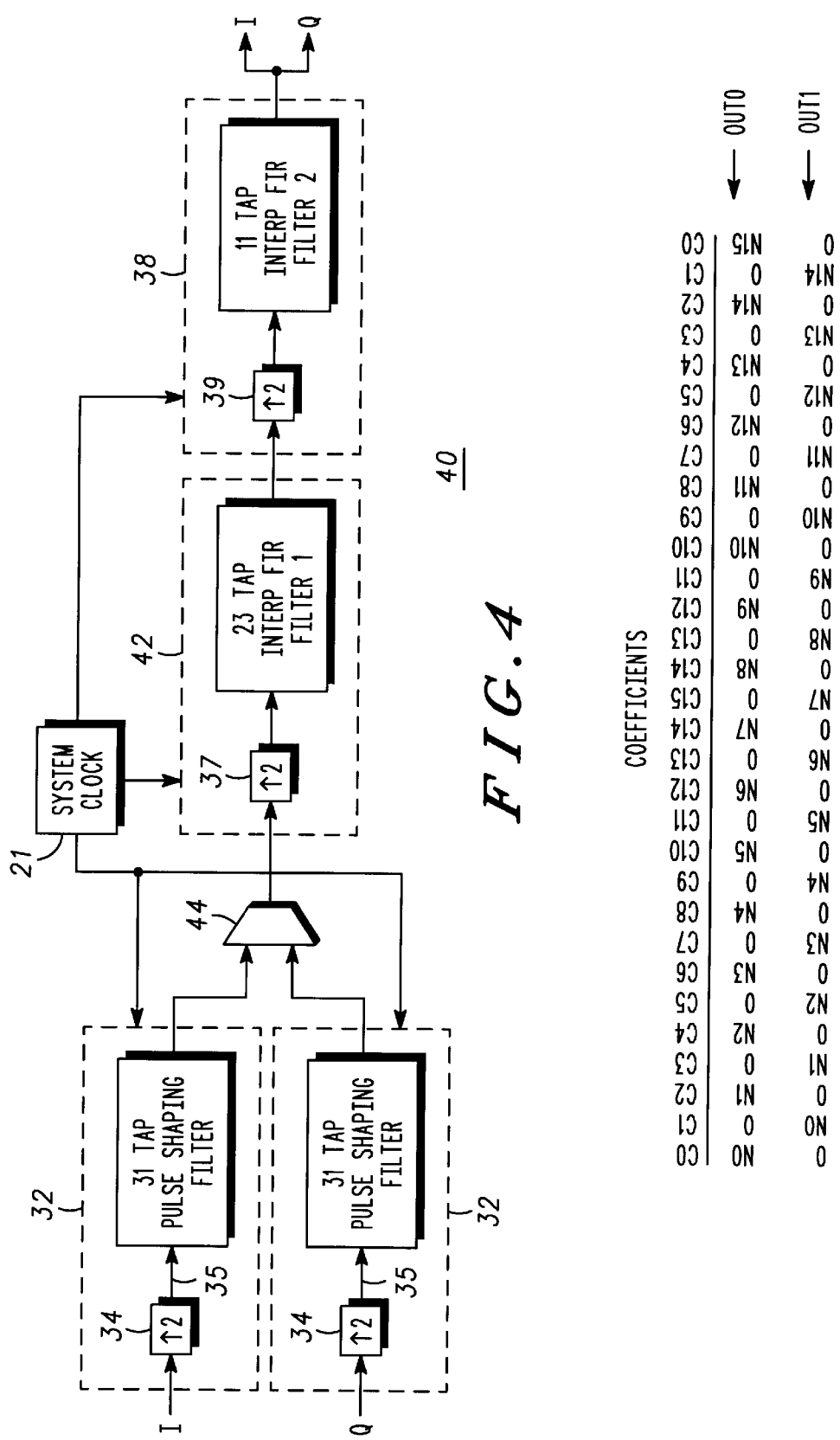
FIG. 4 is a simplified block diagram of a practical application of the filter of FIG. 3.
FIG. 5 is a chart of the application of the pulse shaping filter coefficients of FIG. 3.

The present invention provides an apparatus and method to compensate for timing differences between a digital communication device and a digital signal in order to ensure that the data is transmitted and received correctly. In addition, interpolation filtering is utilized to reduce distortion and cost. Moreover, the amount of computation is reduced over the prior art without a significant performance reduction.

The invention will have application apart from the preferred embodiments described herein, and the description is provided merely to illustrate and describe the invention and it should in no way be taken as limiting of the invention. While the specification concludes with claims defining the features of the invention that are regarded as novel, it is believed that the invention will be better understood from a consideration of the following description in conjunction with the drawing figures, in which like reference numerals are carried forward. As defined in the invention, a radiotelephone is a communication device that communicates information to a base station using electromagnetic waves in the radio frequency range. In general, the radiotelephone is portable and is able to receive and transmit. However, the present invention is equally adaptable to any communication devices, be they wireless or wireline, that transfer data between each other.

The concept of the present invention can be advantageously used on any electronic product with data transfer or requiring the transceiving of RF signals. Preferably, the radiotelephone portion of the communication device is a cellular radiotelephone adapted for personal communication, but may also be a pager, cordless radiotelephone, or a personal communication service (PCS) radiotelephone. The radiotelephone portion is constructed in accordance with a known digital communication standard, such as the CDMA or PCS standards as are known in the art, or future communication standards, such as WCDMA for example, which are presently being developed. The radiotelephone portion generally includes a radio frequency (RF) transmitter, an RF receiver, filters, and at least one timing or clock circuit. The radiotelephone portion can also include a paging receiver. The electronics incorporated into a cellular phone, two-way radio or selective radio receiver, such as a pager, are well known in the art, and can be incorporated into the communication device of the present invention.

Many types of digital communication devices can use the present invention to advantage. By way of example only, the communication device is embodied in a cellular phone having a conventional cellular radio transceiver circuitry, as is known in the art, and will not be presented here for simplicity. The cellular telephone, includes conventional cellular phone hardware (also not represented for simplicity) such as processors and user interfaces that are integrated in a compact housing, and further includes filter and clock circuitry, in accordance with the present invention. Each particular wireline or wireless device will offer opportunities for implementing this concept and the means selected for each application. It is envisioned that the present invention is best utilized in 3GPP version of the WCDMA (Wideband Code Division Multiple Access) digital cellular telephone as described below.

A series of specific embodiments are presented, ranging from the abstract to the practical, which illustrate the application of the basic precepts of the invention. Different embodiments will be included as specific examples. Each of which provides an intentional modification of, or addition to, the method and apparatus described herein. For example, the case of a transmit filter is presented below, but it should be recognized that the present invention is equally applicable to receive filters or other filters types that process digital data and are concerned with timing synchronization.

The 3GPP specification requires that a mobile station simultaneously transmit a pilot channel and multiple data channels each requiring a different spreading code and each requiring separate power control. In practice, the inputs to the transmit filters are 8-bit, 3.84Mcps (chips per second) data streams. A transmit filter performs pulse shape filtering, such as square-root-raised-cosine (SRRC) filtering for example, and the output of the filter is 8× oversampled (30.72 Msps), 10-bit data.

In addtion, the 3GPP specificaion requires the mobile station to transmit in time syncronization to an external clock located in a physically separate communication device. However, the transmit filter is directly coupled to a local clock which will typically have some frequency difference with the clock of the physically separate communication device. Because of this frequency difference, the transmit filter of the mobile station will lose the required time syncronization. When this happens, the mobile station must first detect the time syncronization error, then it must adjust the timing of the transmitted signal back to correct for the error. The adjustment is typically performed within the digital transmit filter.

As shown in FIG. 1, the simplest prior art transmit filter implementation is a fully programmable pulse shaping filter 14, such as a SRRC filter, running at the required output data rate. An 8× rate-increasing zero-stuff block 10 samples and zero stuffs the input data stream 12, as is known in the art. However, within the 3GPP system, the pulse shaping filter 14 would require a 128-tap filter with an output rate of 30.72 Msps (samples per second), before feeding the data stream to a digital-to-analog converter (DAC). Taking advantage of the zeros inserted in the input data, this filter would require 128/8=16 multiply operations at 30.72 MHz. Assuming a 30.72 MHz clock rate, this implementation would require sixteen fully parallel multipliers in the 128-tap filter for each I and Q channel making this processing prohibitively expensive.

In the present invention, and as shown in FIGS. 2 and 3, the computational cost of the transmit filter 20, 30 is reduced significantly by running a smaller pulse shaping filter at a lower data rate and then interpolating the result to produce the required output. As shown in Table 1, the cost of the pulse shaping filter decreases significantly at lower data rates. In general, the present invention is an apparatus such as a timing filter that provides tninni synchronization of digital input data in a communication device. A system clock 21 of the communication device is used to measure and sample the digital input data stream and drives the timing devices of the communication device. The system clock has a system clock rate that is higher than, and typically a multiple of, a data clock rate of the digital input data, and provides a predetermined number of system clock periods per one data clock period. In a preferred embodiment of the present invention, the system clock rate is an integer multiple of the data rate, and an integer number of system clock periods per data period are provided. However, it is also consistent with the present invention to use a system clock that is a non-integer multiple of the data rate, and a non-integer number of system clock periods per data clock period. A first filter is coupled and driven by the system clock and samples the input data at intervals of the system clock periods and increases the sample rate of the input data by performing data insertion. In a preferred embodiment of the present invention, zeros are used for the data insertion. However, the data insertion can also be performed by repeating existing samples, by inserting scaled versions of existing samples, or by inserting previously non-existent samples. The first filter operates on the resultant data with a first set of filter coefficients to provide an output. A second filter is coupled and driven by the system clock and samples the output from the first filter. The second filter samples data and provides data insertion dependent on a desired timing adjust.

A novel aspect of the present invention is a technique for accomplishing a timing adjustment. Specifically, when a timing advance is desired, the first filter shortens the number of system clock periods in relation to the data clock period, and shortens the sampling intervals so as to output actual data at more frequent intervals. Then the second filter samples the actual data output from the first filter with a reduced number of data insertion periods and operates on the resultant data with a second set of filter coefficients. When a timing delay is desired, the first filter lengthens the number of system clock periods in relation to the data clock period, and performs an extra data insertion to fill one of the extra system clock periods, such that more data samples are output in the data clock period. Then the second filter obtains the output from the first filter and operates on the resultant data with a second set of filter coefficients. Specifically, the filters align and multiply the data samples with their respective filter coefficients. After going through the cascaded filters, the data is output.

Although the prior art may include filters with architectures that are superficially similar to the architecture of the present invention shown in FIGS. 2 and 3. In such prior art, rate-increasing filters are built using a cascade of several digital filters. However, this prior art is different from the present invention in that this prior art does not include a method to perform a timing adjustment of an advance or a delay.

In practice, the apparatus is a transmit filter 20 that incorporates a 64-tap pulse shaping filter 22, such as a SRRC filter for example. A 4× rate-increasing zero-stuff block 24 samples the input data stream 26 by measuring a sample in a first one-of-four, 4× oversampled clock cycle and stuffs the remaining three 4× oversampled cycles with data, such as zeros for example. As a result, the input 25 to the 64-tap filter 22 is non-zero for one of every four samples, resulting in 64/4=16 multiply operations at 15.36 MHz or eight multiply operations at 30.72 MHz. Doubling the clock rate could be used, for example, to multiplex the 64-tap filter 22 to accommodate both the I and Q channel of a CDMA signal, for example. The output of the 64-tap filter 22 is 2× oversampled again in another zero-stuff block 27, which results in an equivalent 8× rate increase resulting in an output rate equivalent to that of FIG. 1. A finite-impulse-response (FR) interpolation filter 28 in conjunction with the pulse shaping filter 22 performs a timing adjust and data manipulation on the resultant signal 29 that reduces noise without significantly affecting performance, as will be described below.

For the preferred embodiment of a transmit filter 30 of FIG. 3, additional savings are realized by taking advantage of the symmetry of the filter coefficients, as will be described below, wherein a 31-tap filter 32 is used, and the input data 35 from a 2× rate-increasing block 34 is non-zero for one of every two samples, resulting in (32/2)12=8 multiply operations at 7.68 MHz or two multiply operations per system clock period at 30.72 MHz. The additional savings due to the filter symmetry are possible because an odd number of taps are used in the 31-tap pulse shaping filter. Note that it would also be possible to achieve additional savings with the pulse shaping filter in FIG. 2 by simply choosing an odd number of taps consistant with the present invention. As a result, the embodiment of FIG. 3 provides significant savings due to a smaller pulse shaping filter at even lower data rates. The output of the 31-tap filter 32 is 2× rate-increased again in another zero-stuff block 37, which results in an equivalent 4× oversampling of the original signal. A finite-impulse-response (FR) interpolation filter 36 operates on the resultant signal 33 to provide timing synchronization and noise reduction, as will be described below. Due to the reduced pulse shaping filter, another zero-stuff block 39 again increases the sample rate of the data 31 from the first interpolation filter 36 by a factor of 2, which results in an equivalent 8× oversampling at 30.72 Msps, as resulted in FIGS. 1 and 2, and provides this to the second interpolation filter 38 with reduced multiply operations. The two interpolation filters 36, 38 with the reduced pulse shaping filter 32 further lowers the total amount of required multiply operations.

Of course, the embodiments of FIGS. 2 and 3 require additional circuit elements over the prior art to provide the interpolation filters (28, and 36,38 respectively), but the cost of these filters is small in comparison to the savings afforded by the reduced pulse shaping filter. Furthermore, because the interpolation filters have a fixed response, the coefficients are also fixed, so full advantage can be taken of filter optimization techniques. In particular, the interpolators 28, 36, 38 are half-band filters that include zeros in every other coefficient. Adding zeros in the zero stuff blocks causes high frequency noise, but the interpolation filters remove (smooth) the zeros and thereby reduce noise. Using these filters, the interpolators require only six or three unique multiply operations and run at 7.68 Msps and 15.36 Msps, respectively. The hardware requirements for all cases are shown in Table 2.

The filter coefficients of the interpolation filters (28, 36 and 38) can be further optimized by using Canonical Signed Digit (CSD) representation, as is known in the art. Using CSD, the number of non-zero bits can be reduced to 2.5 non-zero bits per coefficient (see Tables 5 and 6). This makes the "multiply by a constant" one-quarter the cost of a full multiply operation. Using this approximation, the final column of Table 2 shows the relative computational costs of the embodiments of the present invention in comparison to the prior art. Because the embodiment of FIG. 3 has the lowest cost, this implementation is preferred.

TABLE 2

Hardware requirements of filters

|  | Number of Full Multipliers | Number of Multiply-by-a-Constant Blocks | Relative Computational Cost |
| --- | --- | --- | --- |
| FIG. 1 | 16 | 0 | 16 |
| FIG. 2 | 8 | 3 | 8.75 |
| FIG. 3 | 2 | 6 + 3 = 9 | 4.25 |

In the following description, the preferred embodiment of FIG. 3 will be considered, since this case requires the least number of multipliers and hence the smallest implementation of calculations. However, it should be recognized that the embodiment of FIG. 2 also embodies the novel aspects of the present invention.

FIG. 4 is one possible implementation of the transmit filter of FIG. 3 for use on a digital signal, such as the outgoing chips in a QPSK modulated CDMA or WCDMA system having phase modulated I and Q channels, as is known in the art. Whereas FIGS. 1–3 show only a single channel, I or Q, FIG. 4 shows an implementation for both channels, I and Q. A transmit filter 40 uses two 31-tap pulse shaping filter 32 and two interpolation filters 42, 38. The two 31-tap pulse shaping filters 32 are required to run at 30.72 Mhz rate in order to process the two I and Q channels. The two interpolation filters 42,38 are only required to run at 15.36 Mhz rate or less. To further reduce the size and cost of the circuit, the two interpolation filters 42,38 can be time multiplexed (through a multiplexer 44) between the I and Q channels and run at the 30.72 Mhz rate. However, it would be possible to provide two independent data paths for the I and Q signals.

In general operation, the filter 40 comprises a rate-increasing zero-stuff block 34, followed by a 31-tap pulse shaping filter 32 for each of the I and Q channels. The zero

TABLE 1

Calculation cost comparison of pulse shaping filter

|  | Data Rate of Pulse Shaping Filter Output | Number of Taps | Zeros in Input | Symmetry Advantage | Number of Calculations | Required Multipliers |
| --- | --- | --- | --- | --- | --- | --- |
| FIG. 1 | 30.72 Msps | 128 | 7 out of 8 | No | 128/8 | 16 |
| FIG. 2 | 15.36 Msps | 64 | 3 out of 4 | No | (64/4)/2 | 8 |
| FIG. 3 | 7.68 Msps | 31 | 1 out of 2 | Yes | ((32/2)/2)/2 | 2 | stuff blocks 34 will sample each input data stream at the rate of the input data, and insert a datum such as a zero after every sample, creating an output data stream 35 that is two times the rate of the input data stream. The pulse shaping filters 32 receive a new data point every eight system clocks, and will output a result once every four system clocks. i.e., the input data comes in at 3.84 MHz (eight clocks per sample) and goes out at 7.68 MHz (four clocks per sample).

FIG. 5 illustrates how the pulse shaping filter 32 provides a history queue of samples for one channel that is zero-filled and aligned for multiplying with the coefficients of the 31-taps of each of the pulse shaping filters. FIG. 5 is duplicated for each of the I and Q channels. Because the pulse shaping filter increases the data rate by a factor of two, two consecutive outpus, Out0 and Out1, are produced for every input sample during nomral operation. Due to the symmetry of the filter coefficients, the two consecutive outputs, Out0 and Out1, of the filter are defined by the following equations, where N0 is the newest history sample in the queue, N15 is the oldest history sample in the queue, C0 is filter coefficient 0, and C15 is filter coefficient 15:

$$Out0=(N0+N15)*C0+(N1+N14)*C2+(N2+N13)*C4+(N3+N12)*C6+(N4+N11)*C8+(N5+N10)*C10+(N6+N9)*C12+(N7+N8)*C14$$

$$Out1=(N0+N14)*C1+(N1+N13)*C3+(N2+N12)*C5+(N3+N11)*C7+(N4+N10)*C9+(N5+N9)*C11+(N6+N8)*C13+N7*C15$$

As can be seen there are eight multiply operations required for each output. However, only two multipliers and two adders are actually required inasmuch as the operations can be done in parallel since there are four clock cycles available to perform the eight add-multiply-accumulate operations. It should be recognized that multiply operations are more computationally intensive than add operations. Therefore, it is advantageous to minimize multiply operations, and the symmetry of the interpolation filters allows this. It should also be noted that the pulse shaping filter and interpolation filters have static coefficients, but could also be programmable. In particular, it may be beneficial to provide programmable pulse shaping filter coefficients to match channel conditions.

In practice, the history samples are stored in a 16-deep sample history queue that has a queue pointer (qPtr) that points to the newest entry in the queue. The queue pointer advances through the queue decrementally, such that qPtr+1 is the next newest item and qPtr−1 is the oldest item in the sample history queue. There are two operands presented to each adder/multiplier for a total of four output busses from the sample history queue. One operand is always the newer in time history value from N0 through N7, and the other operand is the older in time history value from N8 through N15. The newer operand is referred to as the up operand (up0−1), and the older operand is referred to as the down operand (down0−1).

The two up output busses of the pulse shaping filter are addressed by the upAdr address input, and the two down output busses are addressed by the dwnAdr address input. Table 3 describes what queue location is output on the busses for a given address upAdr and dwnAdr:

TABLE 3

History queue output bus addressing

| Output Bus | Location outputted |
|---|---|
| up0 | UpAdr |
| up1 | UpAdr+1 |
| dwn0 | DwnAdr |
| dwn1 | DwnAdr−1 |

A 16-deep coefficient register array contains coefficients 0 through 15 at addresses 0 through 15. Since two multiply operations are occurring at once, there are two output busses from the coefficient array, (coef0−1). The two output busses are addressed by one address input. Table 4 describes what queue locations are output on the busses for a given address coefAdr (note that all adds are modulo-4 additions):

TABLE 4

Coefficient Array output bus addressing

| Output Bus | Location outputted |
|---|---|
| coef0 | CoefAdr |
| coef1 | CoefAdr+2 |

Figure 6:
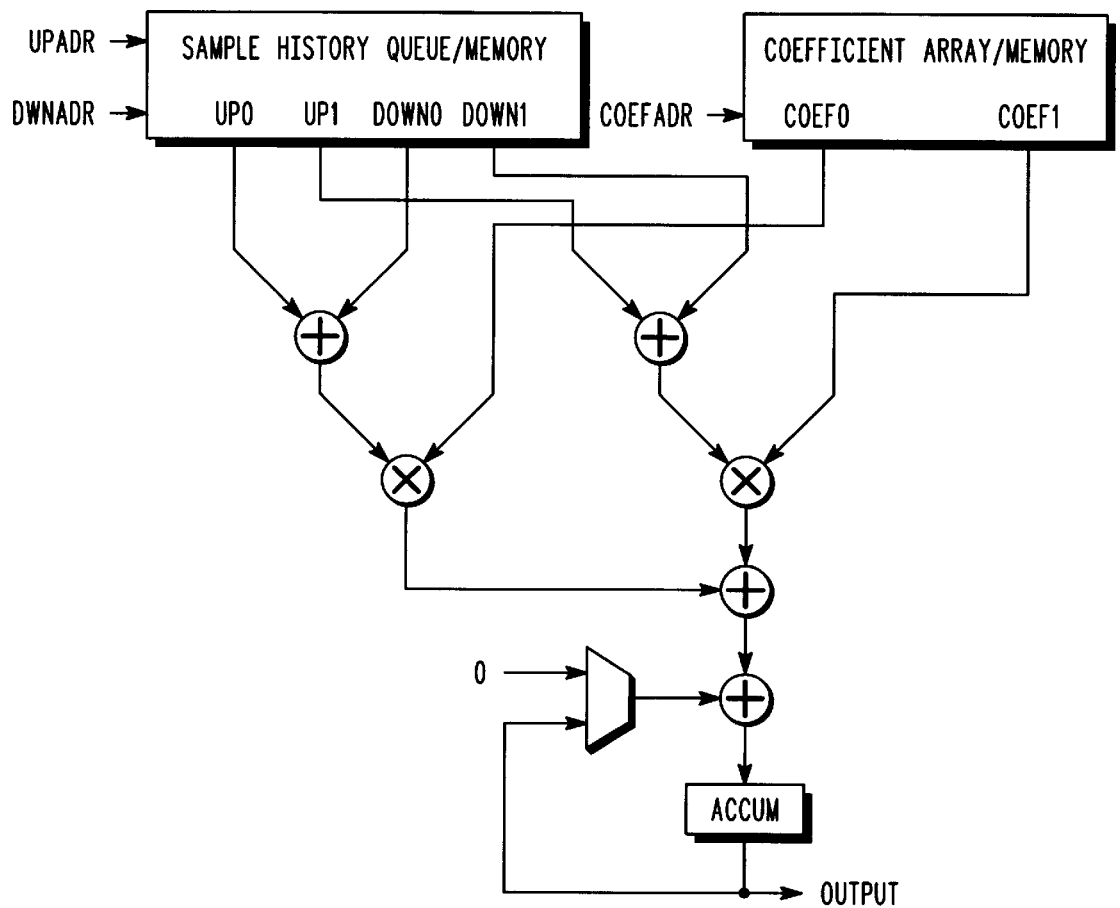
FIG. 6 is a simplified block diagram demonstrating the application of FIG. 5.

FIG. 6 shows a block diagram of the topology of the data paths in the pulse shaping filter (32 in FIG. 4). Note that, although this block diagram is all combinational, some elements are pipelined since all the operations can not be performed in one clock cycle. Care must be taken to pipeline the values coming out of the up, down, and coef output busses to match any pipelining being performed in the data-path. The following example demonstrates how the math is performed in the hardware. For this example, and referring to FIG. 7, the queue pointer of the sample history queue is initially set to 10. The process starts with a new sample being accepted, the queue pointer (qPtr) being decremented and the data, N0, being written into the sample history queue at location 9. An up address pointer (upAdr) will be loaded with the qPtr, and a down address pointer (dwnAdr) will be loaded with the qPtr−1. A cycle counter (fircnt) will be loaded with 0 and counted up to 7. Each time the firCnt is incremented, the upAdr is incremented by two, and the dwnAdr is decremented by two. When the firCnt reaches the count of three, the first output will be available, the upAdr will be reloaded with the qPtr, and the dwnAdr will be reloaded with the qPtr−2. When the firCnt reaches the count of seven, the second output is available. FIG. 8 depicts the address output on the data paths. The two final results will be output during firCnt=3 and firCnt=7 respectively. During firCnt=0 and firCnt=4 the accumulator will be cleared.

The present invention provides a novel way to adjust the timing between the input data stream and the clock of the communication device to provide timing synchronization. A timing adjustment of from zero to ±½ chip is contemplated, although a timing adjustment of about ±¼ chip is preferred. During a ¼ chip timing delay, there will be an additional two systems clocks for one input sample period. During these two additional system clock periods, no operations will occur in the pulse shaping filter. During a ¼-chip advance, there are two fewer system clock cycles during one input sample period. Therefore, during a ¼-chip advance, the operations of the pulse shaping filter are skipped for two system clock periods (specifically when firCnt is 0 and firCnt is 4). This is accomplished by adjusting the counter start values, and adjusting firCnt to skip the count of 4. This will skip processing the lower filter coefficients of the pulse shaping filter that have the least significant (smallest) values, which results in minimal error. In effect the filter is truncated in a manner to least affect performance. In contrast, the prior art does not include the ability to skip the processing of the least significant coefficients.

For example, and referring to the 23-tap interpolation filter 42 of FIG. 4, the interpolation filter includes data from a rate-increasing zero stuff block 37, input into the 23-tap interpolation filter 42. At this point, the filter 42 receives a new data point every four system clocks, and will output a result once every two system clocks. FIG. 9 illustrates how the sample history queue of the 23-tap interpolation filter 42 is zero-stuffed and aligned with the interpolation filter coefficients. In the present invention, the filter coefficients are carefully designed so that many of them are substantially or identically zero. In these cases where any coefficients are identically zero, FIG. 9 includes only the zero to demonstrate that no multiply is required. The interpolation filter 42 will output two consecutive outputs for every input sample received. The two consecutive outputs of the interpolation filter are defined by the following equations, where N0 is the newest history, N11 is the oldest history, C0 is coefficient 0, and C11 is coefficient 11:

$$Out0=(N0+N11)*C0+(N1+N10)*C2+(N2+N9)*C4+(N3+N8)*C6+(N4+N7)*C8+(N5+N6)*C10 \quad Out1=N5*C11$$

The coefficients for the interpolation filters are fixed, and the coefficients were designed to reduce the circuit size of the multipliers. The coefficients were also designed such that many of the coefficients are substantially or identically zero so that multiplication of these coefficients is unnecesary. Table 5 defines the coefficient values of the first interpolation filter 42:

TABLE 5

Interpolation Filter 1 Coefficients

| Coefficient | Value |
|---|---|
| C0 | $-2^{-9}$ |
| C1 | 0 |
| C2 | $2^{-7} + 2^{-9}$ |
| C3 | 0 |
| C4 | $-2^{-5} + 2^{-10}$ |
| C5 | 0 |
| C6 | $2^{-4} + 2^{-7} + 2^{-8}$ |
| C7 | 0 |
| C8 | $-2^{-3} - 2^{-4} + 2^{-7} + 2^{-8}$ |
| C9 | 0 |
| C10 | $2^{-1} + 2^{-3} - 2^{-10}$ |
| C11 | 1 |

In practice, when the mobile station determines that a ¼ chip timing advance is required, the pulse shaping filter is adjusted to output two samples in 6 clock periods, instead of two samples in 8 clock periods. This creates a problem in that there is now more than the normal number of output samples from the pulse shaping filter flowing into the first interpolation filter. To handle this problem, one zero-stuff operation is not performed. This will then require that the first interpolation filter 42 will take two samples from the pulse shaping filter, and output two samples. These extra samples are labeled as Nx.5 in the sample history queue diagram of FIG. 10 to denote that most of the time these values are zeros, except for the case of a timing advance or delay. In this way a timing advance is achieved using the multi-rate filters shown in FIG. 3. This is in contrast to the prior art where timing advances are achieved by simply removing a sample of the output data stream at a higher data rate. Now both Out0 and Out1 values use the same equation and the same logic as described in the following equation:

$$Out0/1=(N0+N11)*C0+(N1+N10)*C2+(N2+N9)*C4+(N3+N8)*C6+(N4+N7)*C8+(N5+N6)*C10+N5.5*C11$$

When the mobile station determines that a ¼ chip timing delay is required, the pulse shaping filter is adjusted to output two samples in 10 clock periods, instead of two samples in 8 clock periods. This results in fewer than the normal number of output samples from the pulse shaping filter flowing into the first interpolation filter. To account for fewer input samples, the 23-tap filter will perform an additional zero-stuff operation on the input data. In this way a timing delay is achieved using the multi-rate filters shown in FIG. 3. This is in contrast to the prior art where timing delays are achieved by simply repeating a sample of the output data stream at a higher data rate.

When a timing advance or delay is performed, the act of removing or adding a zero-stuff introduces distortion into the signal. In the present invention, this noise insertion occurs at a low sample rate and prior to the completion of the interpolation filters. This allows the interpolation filters to smooth the distortion and thus remove a large portion of the undesired noise. This is in contrast to the prior art in which the distortion is introduced at the highest data rate and after all digital smoothing filters are complete. In this way, the present invention reduces the amount of high-frequency noise introduced by a timing advance or delay.

Figures 10, 11:
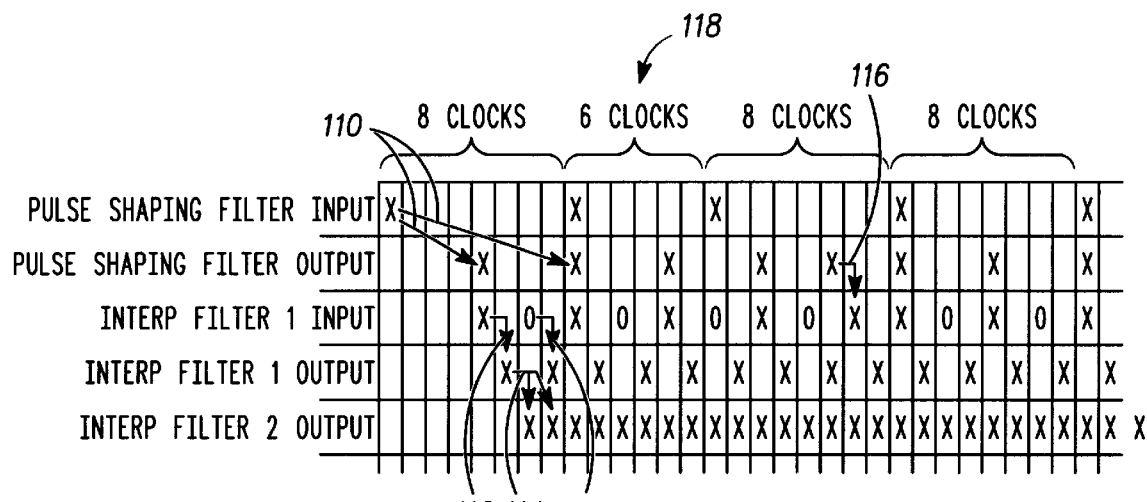
FIG. 10 is a chart of the application of the first interpolator filter coefficients of FIG. 9 with timing adjust, in accordance with the present invention.
FIG. 11 is a chart showing the application of timing advance in the filters of FIG. 3;.

Referring to FIG. 11, starting in normal operation with no advance or delay, the pulse shaping filter receives inputs at an equivalent rate of one sample every eight clocks, and outputs samples 110 at an equivalent rate of one sample every four clocks. The first interpolation filter receives one sample every four clocks, and generates two outputs 112 per input sample. When there is a ¼ chip advance, then the pulse shaping filter outputs 118 at an equivalent rate of one sample every three clocks for two consecutive output samples. The interpolation filter then needs to delay its input sample by one clock, skipping a last zero-stuff, and then use an actual value 116 instead of the skipped zero.

Figures 12, 13:
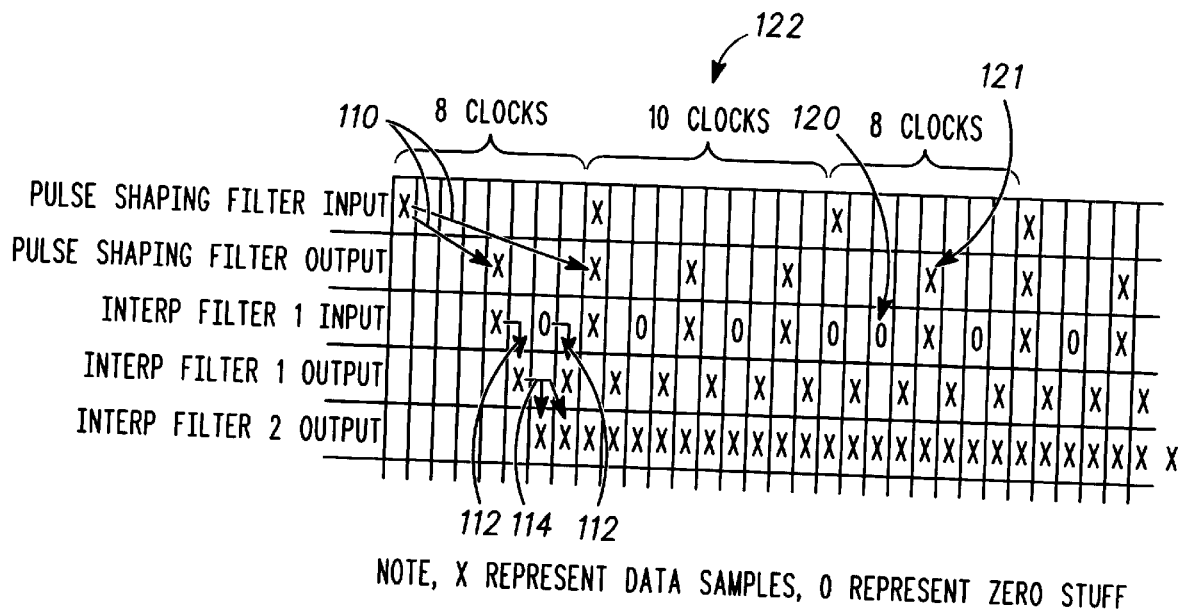
FIG. 12 is a chart showing the application of timing delay in the filters of FIG. 3.
FIG. 13 is a chart of the application of the second interpolator filter coefficients of FIG. 3.

In FIG. 12, when there is a ¼ chip delay, one output 121 of the pulse shaping filter will be delayed by two system clock cycles so that one sample will come in a 10-clock cycle period 122 instead of the normal 8-clock cycle period. The first interpolation filter then needs to add an additional input sample 120 wherein an additional zero-stuff is performed on the input data to the first interpolation filter. Although this implementation adds an additional sample 120 by performing an additional zero-stuff operation, it is also consistent with this invention to add an additional sample using a sample repition operation or by inserting a scaled version of a previous sample. In both the advance and delay cases, the second data interpolation filter 38 of FIG. 4 includes a zero stuff operation 39 followed by an 11-tap, fixed-rate filter operation 38. As a result, this filter 38 receives a new data point every two system clocks, and will output a result once every clock, as shown in FIGS. 11 and 12, to provide the 8× oversampled signal at 30.72 Msps.

FIG. 13 illustrates how the data in the sample history queue of the second interpolation filter 38 is zero-filled and aligned with the coefficients of the filter. The second interpolation filter 38 will output two outputs for every input sample received. The two outputs of the interpolation filter 38 are defined by the following equations, where N0 is the newest history sample, N5 is the oldest history sample, C0 is coefficient 0, and C5 is coefficient 5:

$$Out0=(N0+N5)*C0+(N1+N4)*C2+(N2+N3)*C4 \quad Out1=N2*C5$$

The coefficients for the filter are fixed, and the coefficients are designed to reduce the circuit size of the multiplier. For example, the coefficients were also designed such that many of the coefficients are substabtially or identically zero so that multiplication of these coefficients is unnecesary. Table 6 defines the coefficient values of the second interpolation filter 38:

TABLE 6

Interpolation Filter 2 Coefficients

| Coefficient | Value |
|---|---|
| C0 | $2^{-6}$ |
| C1 | 0 |
| C2 | $-2^{-3} + 2^{-6}$ |
| C3 | 0 |
| C4 | $2^{-1} + 2^{-4} + 2^{-5}$ |
| C5 | 1 |

The present invention also embodies a method for performing timing synchronization between digital input data and a system clock in a communication device. The method comprising a first step of providing a system clock rate that is higher than a data clock rate. The system clock provides a plurality of system clock periods per one data clock period. In the preferred embodiment, the system clock provides a predetermined number of system clock periods per one data clock period, i.e., the system clock rate will be an integer multiple of the data clock rate, however a non-integer multiple may also be used consistent with the present invention. A next step includes sampling the input data at intervals in the system clock periods within the data clock period. Preferably, the interval is periodic, i.e. at regular intervals but not required. A next step includes adjusting the timing between the digital input data and the system clock, e.g. advancing or delaying the digital input data relative to the system clock.

Where advancing is desired, the next step includes advancing the timing of the input data in relation to the system clock, and includes the substeps of shortening the number of system clock periods in relation to the data clock period, and shortening the sampling intervals. This is followed by sampling the input data at the shortened intervals defined in the previous step.

Where delaying is required, the next step includes delaying the timing of the input data in relation to the system clock, and includes the substeps of lengthening the number of system clock periods in relation to the data clock period and sampling the input data at normal intervals and performing a data insertion to fill one of the extra system clock periods, such that more samples are provided in the data clock period. Afterwards, a next step includes outputting the sampled input data for the data clock period.

In particular, it is desired that the sampling that is done in the adjusting step provides more than one data sample per data clock period. Preferably, an interpolation step is added wherein the data samples from the outputing step are interpolated to smooth the output data. This requires that there be more than one data sample, including data insertion samples to be interpolated. Interpolating is performed by an interpolation filter that is generally a finite-impulse-response filter due to the ease of generating the coefficients for same. The interpolation filter operates by aligning and multiplying the data samples with the coefficients of the filter. Further, the coefficients in the aligning and multiplying step can be truncated to remove the least significant coefficients, thereby saving calculations.

In general, the timing adjust available from the present invention is ±¼ of a data clock period (chip rate). However, it should be recognized that the present invention can successfully provide an unbounded timing adjustment range. However, due to practical limitations the range would be limited to within ±½ of a data clock period.

Example

To demonstrate the performance of the proposed transmit filter of the present invention, a computer simulation was performed that compared the preferred embodiment (shown in FIG. 3) both to the prior art solution (shown in FIG. 1) and to a single, large "idealized" pulse shaping filter. The idealized pulse shaping filter runs at 8× the data chip rate and uses a 1024-tap filter. The simulation of the proposed system included emulated fixed-point math. The simulation demonstrated an adjacent channel power rejection (ACPR) of 55.4 dB and an error vector measure (EVM) of 1.1% for the preferred embodiment, as compared to an ACPR of 52.8 dB and an EVM of 0.9% for the prior art. This demonstrates that the present invention provides reduced noise with only a minor degradation in performance.

In summary, it should be recognized that the present invention is an improved filter system that provides timing synchronization with reduced distortion. A timing adjust is provided using actual data samples and the noise effect of data insertion is smoothed by interpolation filters. As such, the benefits of the present invention apply to any sort of wireless or wireline communication system. A number of illustrations have been given showing application to cellular telephones, but the invention is equally applicable to other devices as are known in the art.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. A method for performing timing synchronization between digital input data and a system clock in a communication device, the method comprising the steps of:
   (a) providing a system clock rate that is higher than a data clock rate, the system clock providing a plurality of system clock periods per one data clock period;
   (b) sampling the input data at intervals in the system clock periods within the data clock period;
   (c) adjusting the timing between the digital input data and the system clock such that
   (d) advancing the timing of the input data in relation to the system clock includes the substeps of:
      (d1) shortening the number of system clock periods in relation to the data clock period, and shortening the sampling intervals;
      (d2) sampling the input data at the shortened intervals defined in the previous step, and
   (e) delaying the timing of the input data in relation to the system clock includes the substeps of:
      (e1) lengthening the number of system clock periods in relation to the data clock period;
      (e2) sampling the input data at normal intervals and performing an extra data insertion to fill one of the extra system clock periods, such that more samples are provided in the data clock period; and (f) outputting the sampled input data for the data clock period.

2. The method of claim 1, wherein the sampling steps (d2) and (e2) provide more than one data sample per data clock period, and further comprising the step (g) of interpolating the data samples from the outputting step (f) to smooth the output data.

3. The method of claim 2, further comprising the step of filtering (g) the data samples from the outputting step (f) by aligning and multiplying the data samples with coefficients of a finite-impulse-response filter.

4. The method of claim 3, wherein the coefficients in the aligning and multiplying step are truncated to remove the least significant coefficients, thereby saving calculations.

5. The method of claim 1, wherein the adjusting step (c) includes adjusting the timing synchronization within a range between ±½ of a data clock period.

6. The method of claim 1, wherein the adjusting step (c) includes adjusting the tirning synchronization ±¼ of a data clock period.

7. The method of claim 1, wherein the sampling steps (a), (d2), (e2) include sampling the input data at periodic intervals in the system clock periods.

8. A method for performing timing synchronization between digital input data and a system clock in a communication device, the method comprising the steps of:
   (a) providing a system clock rate that is higher than a data clock rate, the system clock providing a plurality of system clock periods per one data clock period;
   (b) sampling the input data at periodic intervals in the system clock periods within the data clock period;
   (c) adjusting the timing between the digital input data and the system clock such that
   (d) advancing the timing of the input data in relation to the system clock includes the substeps of:
      (d1) shortening the number of system clock periods in relation to the data clock period, and shortening the sampling intervals;
      (d2) sampling the input data at the shortened intervals defined in the previous step, and
   (e) delaying the timing of the input data in relation to the system clock includes the substeps of:
      (e1) lengthening the number of system clock periods in relation to the data clock period;
      (e2) sampling the input data at normal intervals and performing an extra data insertion to fill one of the extra system clock periods, such that more data samples are provided in the data clock period;
   (f) outputting the sampled input data for the data clock period; and
   (g) interpolating the data samples from the previous step to smooth the output data.

9. The method of claim 8, wherein the interpolating step includes aligning and multiplying the data samples with coefficients of a finite-impulse-response interpolation filter.

10. The method of claim 9, wherein the coefficients in the aligning and multiplying step are truncated to remove the least significant coefficients, thereby saving calculations.

11. The method of claim 8, wherein the adjusting step (c) includes adjusting the timing synchronization ±¼ of a data clock period.

12. An apparatus to provide timing synchronization of digital input data in a communication device, the apparatus comprising:
   a system clock that has a system clock rate that is higher than a data clock rate of the digital input data, the system clock providing a plurality of system clock periods per one data clock period;
   a first filter coupled with the system clock, the first filter samples the input data at intervals of the system clock periods and increases the sample rate of the input data by performing data insertion, the first filter operates on the resultant data with a first set of filter coefficients to provide an output; and
   a second filter coupled with the system clock, the second filter increases the sample rate of the output from the first filter, the second filter samples data and provides data insertion dependent on a desired timing adjust, wherein
      when a timing advance is desired, the first filter shortens the number of system clock periods in relation to the data clock period, and shortens the sampling intervals, and wherein the second filter samples the data output from the first filter with a reduced number of data insertion periods and operates on the resultant data with a second set of filter coefficients, and
      when a timing delay is desired, the first filter lengthens the number of system clock periods in relation to the data clock period, and performs an extra data insertion to fill one of the extra system clock periods, such that more samples are output in the data clock period, and wherein the second filter obtains the output from the first filter and operates on the resultant data with a second set of filter coefficients.

13. The apparatus of claim 12, wherein the first filter is a pulse shaping filter, and the second filter is a finite-impulse-response interpolation filter, wherein the interpolation filter interpolates the data to smooth the results.

14. The apparatus of claim 12, wherein the second filter is a finite-impulse-response interpolation filter that aligns and multiplies the data samples with the second filter coefficients.

15. The apparatus of claim 14, wherein the second filter coefficients are truncated to remove the least significant coefficients, thereby saving calculations.

16. The apparatus of claim 12, wherein the apparatus is a timing filter that adjusts the timing synchronization ±¼ of a data clock period.

17. A timing filter that provides timing synchronization of digital input data in a communication device, the apparatus comprising:
   a system clock that has a system clock rate that is higher than a data clock rate of the digital input data, the system clock providing a plurality of system clock periods per one data clock period;
   a first filter coupled with the system clock, the first filter samples the input data at periodic intervals of the system clock periods and increases the sample rate of the input data by performing data insertion, the first filter operates on the resultant data with a first set of filter coefficients to provide an output; and
   an interpolation filter coupled with the system clock, the interpolation filter samples the output from the first filter, the interpolation filter samples data and provides data insertion dependent on a desired timing adjust, wherein
      when a timing advance is desired, the first filter shortens the number of system clock periods in relation to the data clock period, and shortens the sampling intervals, and wherein the interpolation filter samples the data output from the first filter with a reduced number of data insertion periods and operates on the resultant data with a second set of filter coefficients and interpolates to smooth the results, and when a timing delay is desired, the first filter lengthens the number of system clock periods in relation to the data clock period, and performs an additional data insertion to fill one of the extra system clock periods, such that more data samples are output in the data clock period, and wherein the interpolation filter obtains the output from the first filter and operates on the output with a second set of filter coefficients and interpolates to smooth the results.

18. The timing filter of claim 17, wherein the second filter coefficients are truncated to remove the least significant coefficients, thereby saving calculations.

19. The timing filter of claim 17, wherein the apparatus is a timing filter that adjusts the timing synchronization ±¼ of a data clock period.

20. The timing filter of claim 17, wherein the first filter is a pulse shaping filter, and further comprising another interpolation filter cascaded with the interpolation filter, the another interpolation filter performing a similar function as the interpolation filter and allows a further size reduction in the first filter.

* * * * *